United States Patent [19]
Larson, III

[11] Patent Number: 5,187,403
[45] Date of Patent: Feb. 16, 1993

[54] ACOUSTIC IMAGE SIGNAL RECEIVER PROVIDING FOR SELECTIVELY ACTIVATABLE AMOUNTS OF ELECTRICAL SIGNAL DELAY

[75] Inventor: John D. Larson, III, Palo Alto, Calif.

[73] Assignee: Hewlett-Packard Company, Palo Alto, Calif.

[21] Appl. No.: 520,681

[22] Filed: May 8, 1990

[51] Int. Cl.$^5$ .................... H03H 9/38; H04R 17/00
[52] U.S. Cl. ........................................ 310/334; 333/144
[58] Field of Search ............... 333/141, 142, 144, 143, 333/149; 310/334, 366; 367/7, 103, 105, 155, 157; 73/625; 128/660.07, 660.08, 660.01, 661.01

[56] References Cited

U.S. PATENT DOCUMENTS

| | | | |
|---|---|---|---|
| 2,711,515 | 6/1955 | Mason | 333/145 |
| 2,965,851 | 12/1960 | May, Jr. | 333/142 |
| 3,074,048 | 1/1963 | Turner | 333/141 X |
| 3,132,257 | 5/1964 | Yando | 333/141 X |
| 3,289,114 | 11/1966 | Rowen | 367/155 X |
| 3,310,761 | 3/1967 | Brauer | 333/141 |
| 3,435,383 | 3/1969 | Reggia | 333/158 |
| 3,444,482 | 5/1969 | Becker | 333/18 |
| 3,537,039 | 10/1970 | Schafft | 333/144 |
| 3,723,915 | 3/1973 | Adler et al. | 333/152 |
| 3,869,693 | 3/1975 | Jones | 342/375 |
| 4,005,382 | 1/1977 | Beaver | 367/105 |
| 4,013,834 | 3/1977 | Kino | 358/166 |
| 4,058,003 | 11/1977 | Macovski | 73/609 |
| 4,116,229 | 9/1978 | Pering | 73/626 X |
| 4,140,022 | 2/1979 | Maslak | 73/626 |
| 4,211,948 | 7/1980 | Smith et al. | 310/334 X |
| 4,340,872 | 7/1982 | Alter | 333/152 |
| 4,342,971 | 8/1982 | Councilman et al. | 333/152 |
| 4,401,956 | 8/1983 | Joshi | 333/152 |
| 4,680,499 | 7/1987 | Umemura et al. | 310/334 |
| 4,890,268 | 12/1989 | Smith et al. | 367/103 X |

FOREIGN PATENT DOCUMENTS

| | | | |
|---|---|---|---|
| 114178 | 5/1986 | Japan | 367/155 |
| 540355 | 4/1977 | U.S.S.R. | 333/141 |

OTHER PUBLICATIONS

E. Brookner, "Phased Array Radar," Scientific American, Jan. 1985, pp. 94–102.
J. F. Havlice and J. C. Taenzer, "Medical Ultrasonic Imaging: An Overview of Principles and Instrumentation," Proc. I.E.E.E., vol. 67, pp. 620–642.
Hewlett Packard Journal, Oct. 1983, pp. 1–40, W. P. Mason ed., Physical Acoustics, Principles and Methods, Academic Press, vol. 1-A, 1964, pp. 237–238.

Primary Examiner—Paul M. Dzierzynski
Assistant Examiner—Benny T. Lee

[57] ABSTRACT

Apparatus and method to provide a controllable one-dimensional array or two-dimensional array of delay times for an array of acoustic signals propagating in a plurality of bodies of piezoelectric material. Each piezoelectric body is provided with three or more pairs of electrodes, with the first and second electrodes of a pair being spaced apart and positioned on first and second surfaces, respectively, of the piezoelectric body. As an acoustic wave propagates longitudinally in the piezoelectric body, an electrical voltage signal is generated between each electrode pair as the wave passes between the two electrodes of that pair. Time delay is controlled by choice of the longitudinal position of each electrode pair along the piezoelectric body.

5 Claims, 3 Drawing Sheets

ACOUSTIC IMAGE SIGNAL RECEIVER PROVIDING FOR SELECTIVELY ACTIVATABLE AMOUNTS OF ELECTRICAL SIGNAL DELAY

TECHNICAL FIELD

This invention relates to processing of an acoustic signal transmitted by or arriving at one-dimensional and two-dimensional receivers and for compensating for a shift in time associated with receipt of this signal at various receivers.

BACKGROUND ART

Acoustical imaging uses ultrasonic signals, generally with frequencies in the 1-10 MHz range, to provide images of adjacent objects by receipt of waves that are reflected from such objects or of waves that have been transmitted through or diffracted from such objects. One version of such imaging is two-dimensional echocardiography, which uses a reconstruction of objects from the echo waves reflected from each object in the path of the transmitted wave that is received by an array of receivers positioned adjacent to, but spaced apart from, the object.

Where a wave traveling in a first medium, having an acoustic impedance $Z_1 = \rho_1 v_1$ ($\rho_1$ and $V_1$ are mass density and propagation velocity, respectively, in medium no. 1) encounters a second medium at normal incidence, the incident wave will be partly reflected from this surface with an amplitude reflection coefficient given by $r = (Z_2 - Z_1)/(Z_2 + Z_1)$, where $Z_2$ is the acoustic impedance of the second medium. This reflection will change with incidence angle. In the soft tissues of a human body, the reflection coefficient varies from $-10$ dB (between fat and muscle) to about $-23$ dB (between kidney and spleen). These correspond to low level reflections of less than 1% so that most of the acoustic energy is transmitted through the interface and is available for imaging structures that lie further from the transmitter. A relatively high magnitude reflection can take place at a bone/muscle interface, which has a reflection coefficient of about 40% ($-4$ dB). In this instance, only about half the energy is transmitted and available for imaging deeper structures.

Another problem in acoustic imaging of relatively soft structures such as body organs and tissues is that propagation of a wave in any particular body organ or tissue has an associated attenuation with a strongly frequency dependent attenuation coefficient. That is, as a wave propagates in such a medium, its intensity I diminishes from its initial value $I_0$, as propagation distance z increases, according to the relation $$I = I_0 \exp[-2\alpha z], \qquad (1)$$

where the attenuation coefficient o increases approximately linearly with temporal frequency f of the wave: $\alpha(f) = \alpha_0 + \alpha_1 f$ with $\alpha_0$ being a constant approximately equal to 0.1 and $\alpha_1$ being a scaling factor approximately equal to 1 dB/cm-MHz. Thus, for example, a three MHz acoustic wave that has traveled 20 cm through soft tissue has an intensity that is 60 dB (a factor of $10^{-6}$) below its initial intensity level; and if the frequency is increased to $f = 10$ MHz, this acoustic beam would be 200 dB below its initial intensity level. For this reason, acoustic waves of lower frequency, of the order of 1-5 MHz, are used for imaging structures deep in the body and higher frequency acoustic waves, $f = 10$ MHz, are used for imaging structures close to a surface within the body.

The velocity of propagation of a wave with a nominal frequency of 1-10 MHz within the body ranges from $1.41 \times 10^5$ to $1.59 \times 10^5$ cm/sec for various body organs and is not strongly frequency dependent in this range. An average value for wave propagation velocity $v_b$ in the human body of $1.54 \times 10^5$ cm/sec is often used for modeling purposes. An exception to use of this average value is human bone, which has a wave propagation velocity of $4.08 \times 10^5$ cm/sec and has a characteristic impedance that is about 5 times that of the soft organs and tissues within the human body.

Where two or more adjacent organs or tissue interfaces are acoustically imaged within a human body, if these objects lie at different distances from the source or transmitter of the wave, the reflected waves will arrive at the receiver at different times and possibly from different directions relative to a center line that defines the orientation of the array of signal receivers. This has at least two consequences. First, the incoming wave from any one object may not be planar and may arrive from a direction that defines a non-zero incidence angle relative to the receiver array. Second, two incoming waves produced by two spaced apart objects will generally arrive at different times, with different incidence angles and with different shapes for the incoming waves. Other workers in this field often call for dynamical focussing, whereby each receiver in the receiver array is given a variable time delay that is commensurate with the direction from which a given incoming wave arrives. If two such waves are separated sufficiently in time, one set of time delays associated with an array of receivers can be replaced by a second set of time delays in the time interval between arrival of the first incoming wave and arrival of the second incoming wave. This is discussed by Brookner in "Phased Array Radar," Scientific American (Jan., 1985) pp. 94-102.

An example of this approach is disclosed in U.S. Pat. No. 4,116,229, issued to Pering for acoustic imaging apparatus. A time delay associated with a given receiver or transceiver or transducer is decomposed into a first large time delay contribution set by a tap on a master delay line and a second, smaller incremental time delay that is controlled by a set of controllable switches. The total time delay includes the first and second contributions to time delay and the incremental time delays can be changed at a predetermined time by use of the switches. A similar idea is disclosed in U.S. Pat. No. 4,140,022, issued to Maslak, in which focussing occurs by adjusting the phases of the waves. A mixer, in which the phase of the local oscillator is varied, effects the focussing phase variation in the signal.

Jones, in U.S. Pat. No. 3,869,693, discloses a beam scanner for a plane wave arriving at a non-zero incidence angle relative to a linear array (assumed vertical) of transducers. The transducers individually sense the arrival, at possibly different times, of the wave front. Each transducer is provided with a multi-component delay line that includes: (1) a first component that introduces a fixed time delay $\Delta t_1$ that progressively increases as one moves along the liner array from the topmost transducer to the bottommost transducer; (2) a second component that introduces a variable time delay $\Delta t'_2$, wherein the maximum extent of the variable range of $\Delta t'_2$ progressively decreases as one moves along the linear array from the topmost transducer to the bottommost transducer, wherein the minimum extent of the variable range is zero, wherein $\Delta t'_2$ is variable over its range in seven equal time increments; and (3) a third component that introduces a variable time delay $\Delta t''_2$, wherein the maximum extent of the variable range of $\Delta t''_2$ is a fractional $\frac{7}{8}$ths of one of the seven equal increments of the respective value of $t'_2$, wherein $\Delta t''_2$ is variable over its range in three increasingly large time increments, the first increment being 1/7th of its total range, the second increment adding another 2/7ths of its total range and the third increment adding the final 4/7ths of its total range. The second and third time delay components are used to provide a combined time delay, of amount given by the sum $\Delta t_c = M \Delta t'_2 + (m_1/2 + m_2/4 + m_3/8) \Delta t''_2$ ($M=0,1,2,\ldots,7$; $m_1, m_2, m_3$ each $=0$ or 1 independently), for a signal arriving at a transducer. It appears that the combination time delay $\Delta t_c$ is to be combined with the fixed time delay $\Delta t_1$ to obtain the net time delay introduced at a given transducer. The net time delay introduced at a given transducer is not continuous but has 64 discrete values, corresponding to the choices of the four integer coefficients $M$, $m_1$, $m_2$ and $m_3$ of the combination time delay $\Delta t_c$.

Time delay of a signal transmitted by a first transducer and received by a second transducer may be introduced by insertion of a piezoelectric element extending between the two transducers. In U.S. Pat. No. 3,537,039, issued to Schafft, an electrical field is applied transversely to control the time delay of torsional vibrations of the piezoelectric material that carry the signal from the first transducer to the second transducer.

In U.S. Pat. No. 4,342,971, issued to Alter, application of a transverse electrical field alters the length of the piezoelectric element inserted between the first and second transducers and provides a controllable time delay for a signal sent between the two transducers. This approach is also disclosed in U.S. Pat. No. 4,401,956, issued to Joshi. In all these patents, the variable time delay introduced by the electrical field applied to the piezoelectric element appears to be at most a few percent of the time delay associated with the piezoelectric element with no electrical field applied.

Where the means for providing time delay are explicitly disclosed in the prior art, these devices appear to be rather large and electronically complex so that only a modest number of receivers can be provided with variable time delays. Often, the means of providing such variable time delay is not disclosed.

In order to provide adequate sampling of an incoming wave for any incidence angle from 0° to 90°, the receivers in the array should be spaced apart by no more than, and preferably less than, one half the wave length corresponding to the central frequency of the incoming wave, according to the Nyquist theory of sampling. If the central frequency is chosen to be $f=5$ MHz and a propagation velocity of $v = 1.54 \times 10^5$ is assumed, the receiver-to-receiver spacing should be $\lambda/2 = v/2f = 154$ $\mu$m or smaller. A one-dimensional array having a modest number $N=100$ such receivers would require that all these receivers be approximately linearly aligned and uniformly spaced along a distance of about 1.5 cm. For a two-dimensional array with $N=10^4$ such receivers, this many receivers would have to be positioned in a rectangle or similar figure of area approximately 2.25 cm$^2$. It is unlikely that this could be done for the receivers with variable time delay discussed in the previous literature.

What is needed is acoustic imaging apparatus that will allow introduction of controllable, variable time delay in the signal produced at each receiver in a one-dimensional or two-dimensional array and will allow a large number of such receivers to be positioned in a very small length or small area representing the receiver array. Such receivers should, preferably, also allow the time delay introduced at any one receiver to be changed in a time of the order of microseconds or less in order to provide adequate discrimination between two incoming acoustic waves corresponding to two different objects to be imaged by the apparatus.

SUMMARY OF THE INVENTION

These needs are met by apparatus that includes a plurality of signal receivers of very small size, each receiver having a time delay means connected thereto for introducing a separately determined time delay into the incoming signal received at that receiver and for changing the time delay at a predetermined time in a time interval of no more than one microsecond.

The time delay may be any of a sequence of time delay increments $0, \Delta t_d, 2\Delta t_d, 3\Delta t_d, \ldots$ in one embodiment where the fundamental time delay $\Delta t_d$ is controllable. In one embodiment, a time delay module to produce such a time delay may include a piezoelectric crystal having an associated velocity of sound $v_{PZT}$ in the crystal and connected between a first spatial point and a second spatial point for propagation of a signal therebetween. The crystal has first and second substantially planar faces that are approximately parallel to a line extending from the first point to the second point. A plurality of $N$ pairs of spaced apart electrodes is included, where one of each pair of electrodes is positioned on a first crystal face and the other electrode of the pair is positioned on the second crystal face. If the electrode pairs are numbered $i=1, 2, \ldots, N$, the $N$ electrodes (one from each pair) positioned on one of the faces of the crystal should be positioned so that a line drawn on this face approximately parallel to the line extending from the first point to the second point will intersect the electrodes $i=1, 2, \ldots, N$ in that order. The $N$ electrodes positioned on each face of the crystal are electrically isolated from one another, and each pair of electrodes is provided with an activatable signal line connected to one of these two electrodes, where maintenance of the signal line in an activated state causes an acoustic signal propagating in the crystal from the first point to the second point to generate an electrical signal in the signal line connected to an electrode as the acoustic signal passes between the two electrodes of an electrode pair. Because the propagating acoustic signal passes between each electrode pair $i=1, 2, \ldots, N$ in serial order, an electrical signal is generated in signal line $i$ attached to an electrode of electrode pair no. $i$ at a time $\tau_i$ with $\tau_1 < \tau_2 < \ldots \tau_4 < \ldots \tau_N$. If the electrode pairs are identical and adjacent electrode pairs are equidistantly spaced along the line joining the first point and the second point, the time delays $\tau_i$ should satisfy the relation $\tau_2 - \tau_1 = \tau_3 - \tau_2 = \ldots = \tau_i - \tau_{i-1} = \ldots = \tau_N - \tau_{N-1} = \Delta\tau$ so that controllable time delays of $m\Delta\tau$ ($m=1, 2, \ldots, N-1$) can be introduced in the electrical signals propagating in a signal line attached to one of the pair no. $i$ of electrodes. Other controllable time delay periods can also be introduced.

BEST MODE FOR CARRYING OUT THE INVENTION

Figure 1:
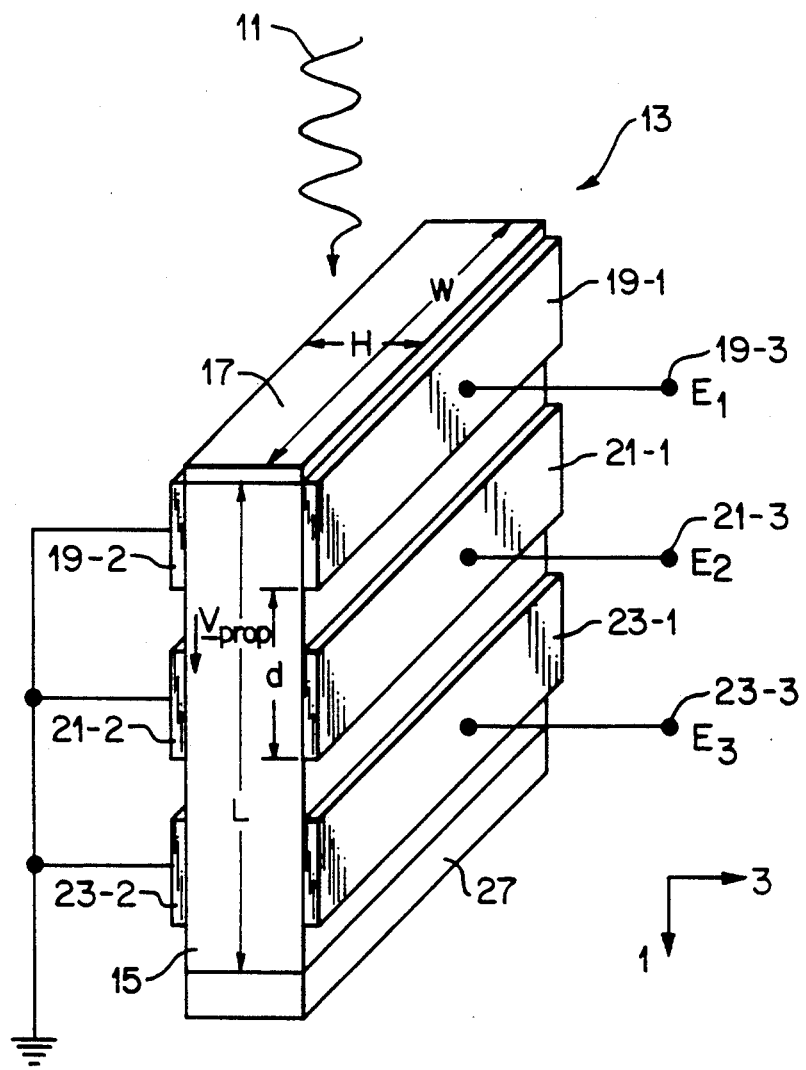
FIG. 1 is a perspective view of one embodiment of the invention.

With reference to FIG. 1, an incident acoustical wave 11 arrives at an acoustic image acquisition module 13 constructed according to one embodiment of the invention. The module 13 includes a piezoelectric material (PZT) 15 to receive the incident wave 11 and allow the wave to propagate longitudinally in a direction indicated by $v_{prop}$ in which the PZT material 15 has length L. Optionally, the module 13 may include a matching layer 17 that first receives the incident wave 11 and passes the transmitted portion of this wave to the PZT material 15, in order to achieve better acoustic impedance matching of the ambient medium in which the wave 11 propagates to the PZT material. For example, tissue or water has a relative impedance of 1.5, silicon has a relative impedance of about 20 and a representative PZT material such as PZT-5A has a relative impedance of about 25. Thus, although silicon and the PZT material PZT-5A are reasonably well matched in impedance, either of these materials is poorly matched to tissue or water, so that use of a matching layer such as 17, shown in FIG. 1, is advisable in such situations. The PZT material 15 may have width W and thickness H of the order of 100 μm and 100 μm, respectively. As the transmitted acoustic wave travels from a first end to a second end of the PZT material 15, it consecutively passes between three or more pairs of electrodes 19-1 and 19-2, 21-1 and 21-2, and 23-1 and 23-2 as shown. One of each pair of electrodes, such as 19-2, 21-2 and 23-2, is grounded. Passage of the acoustic wave between a pair of such electrodes, such as 19-1 and 19-2, induces a voltage difference on one of these electrodes relative to the other electrode, through the piezoelectric effect. See *Physical Acoustics, Principles and Methods*, volume 1-A, edited by W. P. Mason, Academic Press, 1964, pp. 237-238, where the particular case of a length expander bar with electric field perpendicular to the length is discussed. This is also referred to as the side electroded resonator in the frequency control literature. The voltage V induced by a mechanical strain $S_1$ of the propagating acoustical signal is such that: V is proportional to $[\alpha]S_1/d_{31}$,
where $d_{31}$ = piezoelectric strain constant,
  H = thickness of the crystal,
  3 is the poling direction, and
  1 is the wave propagation direction.

As the transmitted portion of the incident acoustic wave passes between the first pair 19-1 and 19-2 of electrodes, the piezoelectric material positioned between these two electrodes undergoes a small change in electrical polarization, which is sensed by the electrode pair and produces a non-zero electrical signal on a lead 19-3 that is connected to the non-grounded one of these two electrodes 19-1. The magnitude of the signal produced on the lead 19-3 is directly proportional to the magnitude of the transmitted portion of the incident acoustical signal 11. In a similar manner, the electrode pairs 21-1 and 21-2, and 23-1 and 23-2, produce electrical signals on their respective leads 21-3 and 23-3 that are connected to the electrodes 21-1 and 23-1, respectively, as the transmitted portion of the acoustical signal 11 passes between the respective pair of electrodes. Optionally, the PZT material 15 may have a backing layer 27 attached to a second surface of the PZT material to receive and attenuate the energy of the transmitted portion of an incident acoustic wave that has passed through the PZT material from one end to the other.

If consecutive pairs of electrodes are spaced apart by the same distance, measured in the longitudinal direction along the PZT material 15, the electrical signals observed on the leads 21-3 and 23-3 will be delayed in time by measurable time delays $\Delta t$ and $2\Delta t$, respectively, relative to the time at which the corresponding electrical signal is received on the electrode lead 19-3. In this embodiment, by choice of the distance d between the leading edges, or between the trailing edges, of two consecutive pairs of electrodes, one can control the time delay $\Delta t_d = d/v_{PZT}$, where $v_{PZT}$ is the propagation velocity of the transmitted portion of the incident acoustic wave within the PZT material in the longitudinal direction.

Figure 2A:
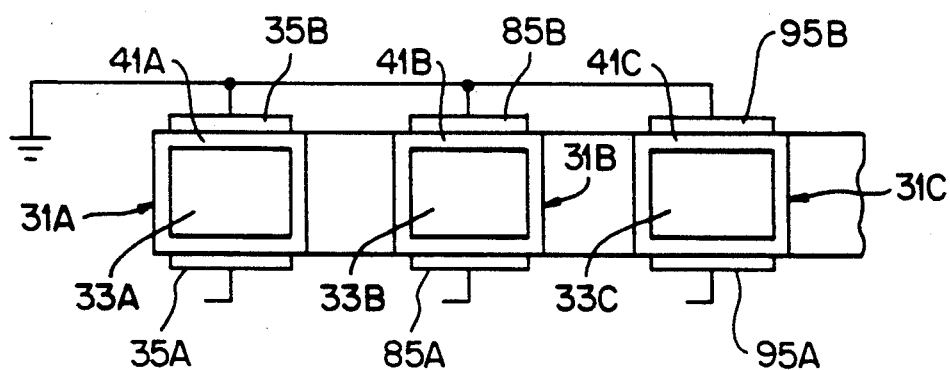
FIGS. 2A and 2B are plan view and side view of an embodiment of the invention involving three independent time delay modules.
Figure 2B:
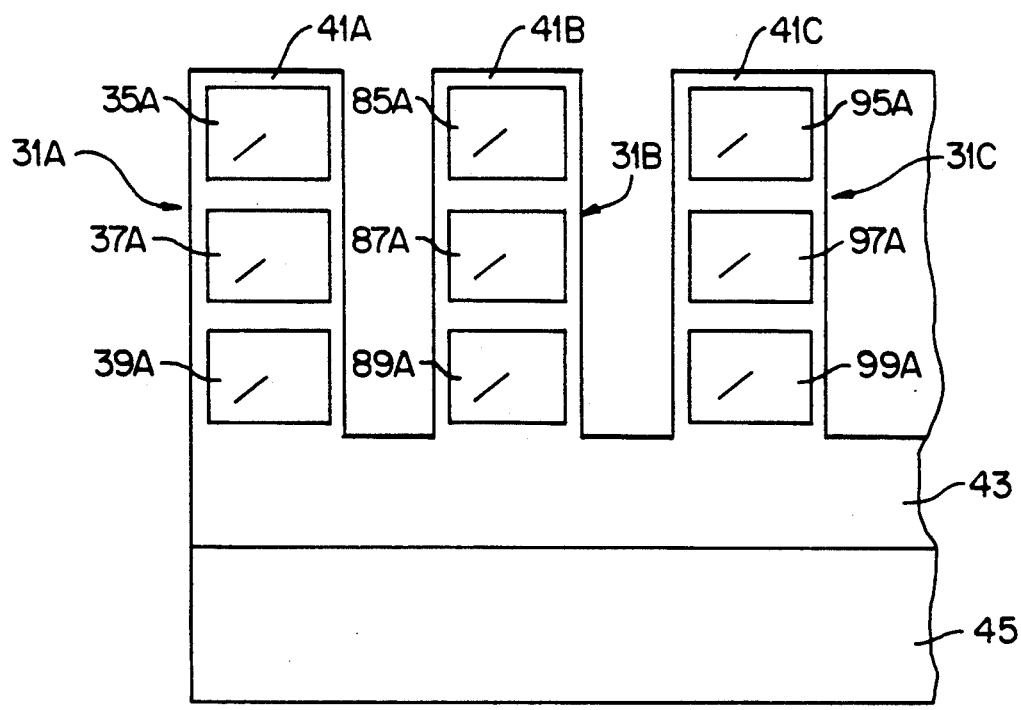

FIGS. 2A and 2B illustrate a plan view and a side view, respectively, of an embodiment of the invention that uses three or more of the image acquisition modules 31A, 31B and 31C that are physically separated from one another by intervening gaps as shown. For example: the image acquisition module 31A has an acoustic signal receiving area 33A; the image acquisition module 31B has an acoustic signal receiving area 33B; and the image acquisition module 31C has an acoustic signal receiving area 33C; all shown in FIG. 2A. (Acoustic signal receiving areas 33A, 33B, and 33C are not shown in FIG. 2B) Image acquisition module 31A has a sequence of three or more electrodes 35A, 37A and 39A, shown in FIG. 2B, that each represent one of a pair of electrodes that are associated as are, for example, the electrodes 19-1 and 19-2 in FIG. 1. Three or more isolated blocks 41A, 41B and 41C of PZT material are positioned as shown in FIGS. 2A and 2B. The block 41A of PZT material has three pairs of electrodes, 35A and 35B, 37A and 37B, and 39A and 39B positioned facing one another in a manner similar to that shown for the three pairs of electrodes in FIG. 1. (Electrode 35B is shown in FIG. 2A but is not shown in FIG. 2B. Electrodes 37A and 39A are shown in FIG. 2B but are not shown in FIG. 2A. Electrodes 37B and 39B are not shown in FIGS. 2A and 2B.) In a similar manner, the two blocks of PZT material 41B and 41C each have three or more pairs of electrodes positioned on opposite sides and facing one another: the block 41B has three pairs of electrodes, 85A and 85B, 87A and 87B, and 89A and 89B; the block 41C has three pairs of electrodes, 95A and 95B, 97A and 97B, and 99A and 99B. (Electrodes 85B and 95B are shown in FIG. 2A but are not shown in FIG. 2B. Electrodes 87A, 89A, 97A, and 99A are shown in FIG. 2B but are not shown in FIG. 2A. Electrodes 87B, 89B, 97B, and 99B are not shown in FIGS. 2A and 2B.)

An incident acoustical signal is received by one or more of the acoustic acquisition modules 31A, 31B and 31C in the respective signal-receiving regions 33A, 33B and 33C. An acoustic signal, received at one or more of these signal-receiving regions, will propagate longitudinally from one end of the corresponding block of PZT material to the other and will be received by a backing layer 43 of material that will attenuate the energy associated with the signal. Optionally, the backing layer 43 may be provided on a substrate 45 for additional mechanical integrity. Each of the modules 31A, 31B and 31C may be associated with a different sensor in a one- or two-dimensional array of acoustic sensors so that an acoustic signal propagating into adjacent PZT blocks of material such as 41A and 41B may have time delays relative to one another. These time delays can be partially or fully compensated for or removed by use of the time delayed signals produced in the electrode leads 19-3, 21-3 and 23-3 of FIG. 1, as discussed above. For example, if a time delay of $2\Delta t_d$ is desired for the signal propagating in PZT block 41B relative to the signal propagating in PZT block 41A (FIG. 2B), the acoustic signal associated with the PZT block 41A can be extracted from the electrode lead corresponding to the first pair of electrodes, nearest to the signal-receiving region at the front end, and the acoustic signal corresponding to the PZT block 41B could be extracted on the electrode lead connected to the third pair of electrodes (with associated time delay $2\Delta t_d$) The configuration illustrated in FIG. 1 provides gross time delays $n\Delta t_d$ ($n=0, \pm 1, \pm 2, \ldots$), where the fixed interval $\Delta t_d$ is controllable within reason. To this may be added a continuous time delay $\Delta t_c$, by means of the invention disclosed in the patent application Ser. No. 07/508,025 (filed 11 Apr. 1990) and assigned to the assignee of this application.

With reference to FIG. 1, where a time delay $n\Delta t_d$ is desired for an acoustic signal propagating in a particular block of PZT material, the corresponding electrode lead would be activated, and all other electrode leads for that block would be inactivated so that a signal representative of the acoustic signal propagating in the PZT block would appear only on that electrode lead.

Figure 3:
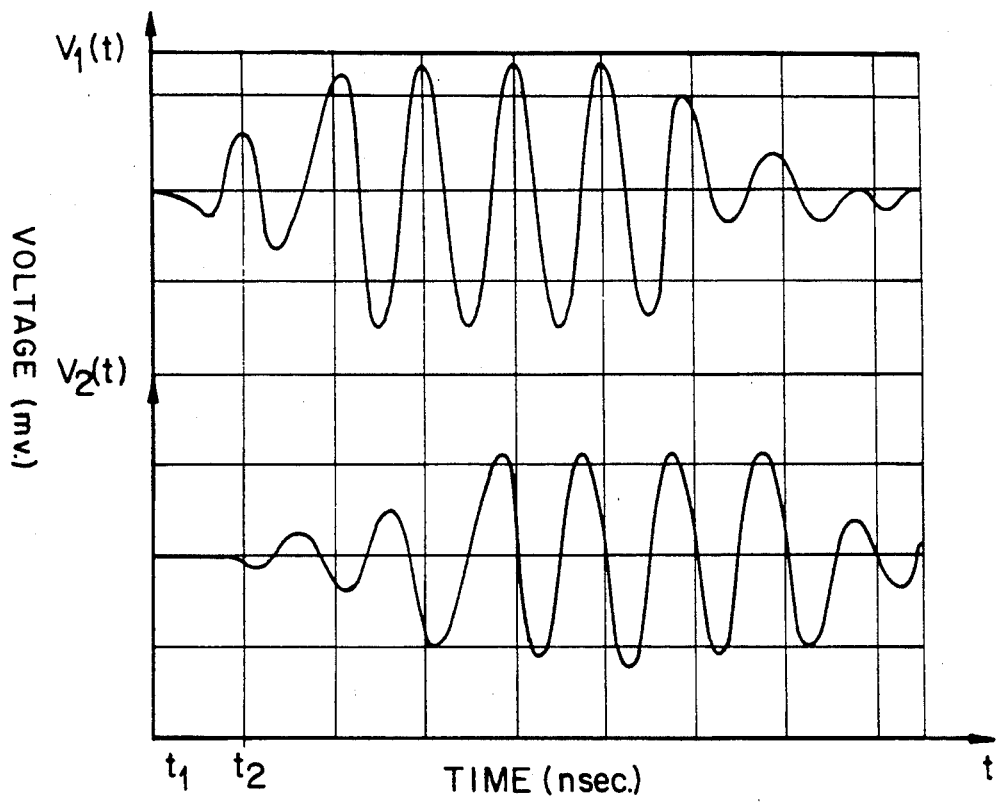
FIG. 3 is a graphical view of two oscilloscope traces representing signals generated at two adjacent electrodes pairs in a single time delay module as an acoustic signal passes serially between each electrode pair.

FIG. 3 illustrates the traces on an oscilloscope of the signals $V_1(t)$ and $V_2(t)$ produced on two adjacent signal lines, similar to 19-3 and 21-3 in FIG. 2, when an acoustic signal passes between two adjacent pairs of electrodes, similar to 19-1/19-2 and 21-1/21-2 in FIG. 1, in a PZT crystal. The two pairs of electrodes were positioned a longitudinal distance $d=440$ μm apart as in FIG. 1. The ordinate divisions (amplitude or y-axis) and the abcissa divisions (time or x-axis) are 5 millivolts and 200 nanoseconds, respectively. The two traces are activated at times $t_1$ and $t_2$ that differ by an amount of approximately $\Delta t = t_2 - t_1 = 150$ nsec, which corresponds to a velocity of signal propagation in the PZT crystal of $$V_{PZT} = \frac{d}{\Delta t} = \frac{440 \ \mu m}{150 \ nsec} = 2.93 \times 10^5 \ cm/sec,$$

which is approximately the correct propagation velocity in PZT-5A. Thus, the configuration appears to yield accurate trace differences with signal oscillation frequencies of about 5 MHz, and the oscillation produced by passage of an acoustic signal in the PZT crystal last approximately 1.6 μsec.

Figure 4:
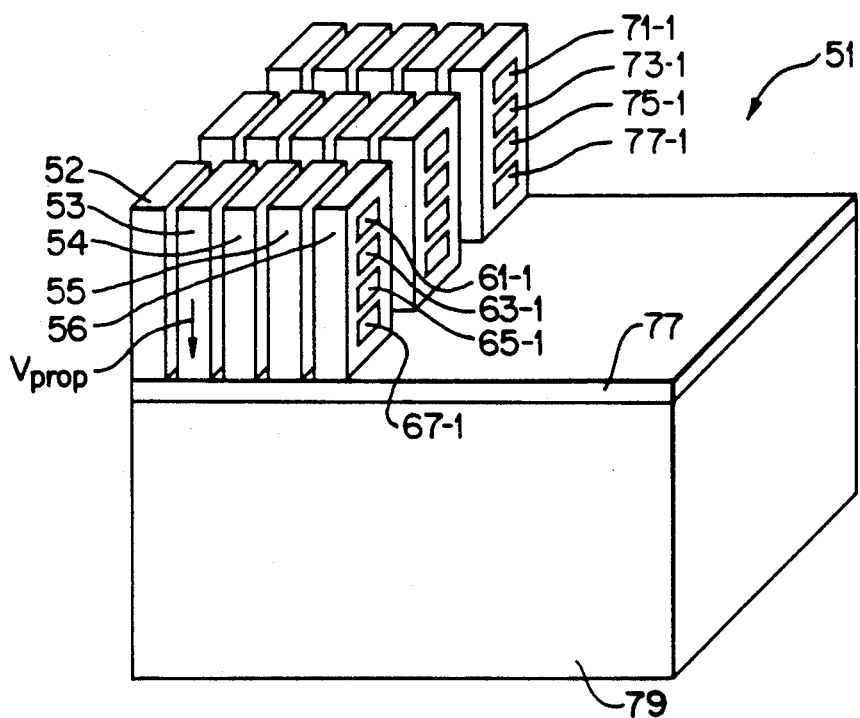
FIG. 4 is a perspective cutaway view of an embodiment of the invention that provides a two-dimensional matrix of time delayed signals.

FIG. 4 presents a cutaway view of an embodiment 51 that includes three rows of isolated blocks of PZT crystals, with the front row having five blocks 52, 53, 54, 55 and 56 as shown. In a similar manner, each block of PZT material has four electrodes spaced apart longitudinally along the block, and each of these electrodes has a corresponding electrode (not shown) on an opposite face of the block, for example: the block 56 of PZT material has four electrodes 61-1, 63-1, 65-1 and 67-1 spaced apart longitudinally along the block 56, and each of these electrodes has a corresponding electrode (not shown) on an opposite face of the block 56. The block 106 of PZT material has four electrodes 71-1, 73-1, 75-1 and 77-1 spaced apart longitudinally along the block 106, and each of these electrodes has a corresponding electrode (not shown) on an opposite face of the block 106. Optionally, the backing layer 77 may be provided on a substrate 79 for additional mechanical integrity. An acoustical signal propagates in two or more of the PZT blocks in the direction indicated as $v_{prop}$, and the relative time delay between these signals can be compensated for by the voltage signals produced between a pair of activated electrodes positioned on one of the PZT blocks as discussed in connection with FIG. 1.

The two-dimensional configuration shown in FIG. 4 may be used to implement a two-dimensional matrix of time delays, one such delay being associated with each acoustic signal sensor in a two-dimensional array of such sensors. Alternatively, the configuration shown in FIGS. 1, 2 or 4 may be used to create a two-dimensional matrix of time delayed signals, initially produced in the signal lead lines 19-1, 21-1 and 23-1 in FIG. 1 and then propagating longitudinally along the PZT crystal 15 there, to drive a two-dimensional phased array of transmitters to produce steering or focusing of a wave that propagates outward from these transmitters.

I claim:

1. Apparatus for producing an electrical signal with a controllable time delay, where the electrical signal is produced by an acoustic signal that propagates from a first spatial point to a second spatial point, the apparatus comprising:

a body of piezoelectric material having a longitudinal dimension; said acoustic signal propagating within the body from the first spatial point, along the longitudinal dimension of the body, to the second spatial point; the body having a first body face and a second opposing body face that are approximately parallel to one another and that are approximately parallel to the longitudinal dimension of the body;

a plurality of pairs of spaced apart electrodes with a first member of each electrode pair being grounded and a second member of each electrode pair being electrically isolated from the first member, and said first and second members of each electrode pair being positioned on the first and second body faces, respectively; the pairs of electrodes respectively being positioned along the longitudinally dimension of the body in such a way that as the acoustical signal propagates along the longitudinal dimension, the acoustic signal consecutively passes between said plurality of pairs of spaced apart electrodes; and a plurality of individually activatable electrical signal lines; each signal line being connected to a respective second member of a respective electrode pair, wherein activation of any one signal line produces said electrical signal on said any one signal line when said acoustic signal passes between said respective electrode pair.

2. The apparatus of claim 1, further comprising an acoustical impedance-matching layer; said matching layer being positioned contiguous to an acoustic signal-receiving area of said piezoelectric body; said signal-receiving area being operative for receiving said acoustic signal and for introducing said acoustic signal to propagation along the longitudinal dimension of the body of piezoelectric material; said impedance matching layer being operative to reduce reflection of the acoustic signal received at the signal-receiving area.

3. A plurality of apparati for producing a plurality of electrical signals with individually controllable time delay, where each electrical signal is produced by an acoustic signal that propagates from a respective first spatial point to a respective second spatial point, the plurality of apparati comprising:

A two-dimensional array of apparati for producing said plurality of electrical signals with individually controllable time delays from said acoustic signal propagating in each apparatus, each apparatus being isolated from every other apparati, and each apparatus comprising:

a body of piezoelectric material having a longitudinal dimension; said acoustic signal propagating within the body from the respective first spatial point, along the longitudinal dimension of the body, to the respective second spatial point; the body having a first body face and a second opposing body face that are approximately parallel to one another and that are approximately parallel to the longitudinal dimension of the body;

a plurality of pairs of spaced apart electrodes with a first member of each electrode pair being grounded and a second member of each electrode pair being electrically isolated from the first member, and said first and second members of each electrode pair being positioned on the first and second body faces, respectively; the pairs of electrodes respectively being positioned along the longitudinal dimension of the body in such a way that as the acoustic signal propagates along the longitudinal dimension, the acoustic signal consecutively passes between said plurality of pairs of spaced apart electrodes; and a plurality of individually activatable electrical signal lines; each signal line being connected to a respective second member of a respective electrode pair, wherein activation of any one signal line produces one of said plurality of electrical signals on said any one signal line when said acoustic signal passes between said respective electrode pair.

4. A method for producing a two dimensional array of electrical signals with individually controllable time delays by propagation of an acoustic signal, the method comprising the steps of:

applying an acoustic signal to a two-dimensional array of bodies of piezoelectric material, each body being isolated from the other bodies, each body having a respective longitudinal dimension, said acoustic signal propagating within each body along the respective longitudinal dimension from a respective first spatial point to a respective second spatial point, each piezoelectric body having respective first and second body faces that are approximately parallel to one another and that are approximately parallel to the respective longitudinal dimension;

positioning a plurality of pairs of spaced apart electrodes along each piezoelectric body, a first member of each electrode pair being electrically grounded, a second member of each electrode pair being electrically isolated from the first member, and said first and second members of each electrode pair being positioned on the first and second body faces, respectively; the pairs of electrodes respectively being positioned along the respective longitudinal dimension of each body in such a way that as the acoustic signal propagates along the respective longitudinal dimension, the acoustic signal consecutively passes between said plurality of pairs of space apart electrodes; and connecting each of a plurality of individually activatable electrical signal lines to a respective second member of a respective electrode pair;

activating any one signal line to produce one of said plurality of electrical signals on said any one signal line when said acoustic signal passes between said respective electrode pair.

5. The method of claim 4, further comprising the step of positioning a respective acoustical impedance-matching layer contiguous to a respective acoustic signal-receiving area of each of said piezoelectric bodies; each acoustic signal-receiving area being operative for receiving said acoustic signal and for introducing said acoustic signal to propagation along the respective longitudinal dimension of the respective body; each impedance-matching layer being operative to reduce reflection of the acoustic signal received at the respective signal receiving area.

* * * * *

UNITED STATES PATENT AND TRADEMARK OFFICE
CERTIFICATE OF CORRECTION

PATENT NO. : 5,187,403
DATED : Feb. 16, 1993
INVENTOR(S) : John D. Larson, III

It is certified that error appears in the above-identified patent and that said Letters Patent is hereby corrected as shown below:

Column 1, Line 26, change "$V_1$" to --$v_1$--;

Column 1, Line 56, change "o" to --$a$--;

Column 2, Line 63, change "liner" to --linear--;

Column 4, Line 59, change "$T_2 < ... T_4 < ... T_N$" to --$T_2 < ... T_i < ... T_N$--;

Column 7, Line 53, change "abcissa" to --abscissa--;

Column 8, Line 59, change "longitudinally" to --longitudinal--;

Column 8, Line 60, change "acoustical" to --acoustic--.

Signed and Sealed this

Twenty-third Day of August, 1994

Attest:

BRUCE LEHMAN

*Attesting Officer*     *Commissioner of Patents and Trademarks*